United States Patent [19]
Inoguchi et al.

[11] Patent Number: 5,168,006
[45] Date of Patent: Dec. 1, 1992

[54] WOVEN FABRIC FOR FIBER-REINFORCED THERMOPLASTIC RESIN LAMINATE

[75] Inventors: Hirokazu Inoguchi; Shoichi Watanabe; Shin Kasai; Keiichi Kato; Mikiya Fujii, all of Fukushima, Japan

[73] Assignee: Nitto Boseki Co., Ltd., Fukushima, Japan

[21] Appl. No.: 441,332

[22] Filed: Nov. 22, 1989

Related U.S. Application Data

[63] Continuation of Ser. No. 157,711, Feb. 19, 1988, abandoned.

[30] Foreign Application Priority Data

Aug. 13, 1987 [JP] Japan ................... 62-200905

[51] Int. Cl.$^5$ ................................. B32B 7/00
[52] U.S. Cl. ................... 428/245; 428/246; 428/257; 428/260; 428/902
[58] Field of Search ............ 428/224, 257, 258, 259, 428/229, 391, 902, 245, 246, 260; 139/420 C, 420 R

[56] References Cited

U.S. PATENT DOCUMENTS

| | | | |
|---|---|---|---|
| 3,268,384 | 8/1966 | Frick et al. | 139/420 C |
| 4,066,106 | 1/1978 | Graham | 139/420 C |
| 4,282,011 | 8/1981 | Terpay | 139/420 C |
| 4,479,999 | 10/1984 | Buckley et al. | 428/245 |
| 4,539,249 | 9/1985 | Curzio | 428/296 |
| 4,684,567 | 8/1987 | Okamoto et al. | 428/257 |

FOREIGN PATENT DOCUMENTS

| | | |
|---|---|---|
| 2931721 | 8/1979 | European Pat. Off. |
| 0033244 | 8/1981 | European Pat. Off. |
| 0138294 | 4/1985 | European Pat. Off. |
| 0182335 | 5/1986 | European Pat. Off. |
| 1779262 | 7/1968 | Fed. Rep. of Germany |
| 3341292 | 11/1983 | Fed. Rep. of Germany |
| 28543 | 7/1983 | Japan |
| 1200342 | 7/1970 | United Kingdom |
| 2093768A | 9/1982 | United Kingdom |
| 2105247 | 3/1983 | United Kingdom |

Primary Examiner—James L. Bell
Attorney, Agent, or Firm—Wegner, Cantor, Mueller & Player

[57] ABSTRACT

Disclosed is a woven fabric used for production of fiber-reinforced thermoplastic resin laminates wherein each or warps and wefts which constitute the fabric comprises at least one kind of thermoplastic resin yarns and at least one kind of reinforcing yarns and the reinforcing yarns of the warps and wefts as such constitute a weave. The weave constituted of only the reinforcing yarns is preferably a plain weave. The fiber-reinforced thermoplastic resin laminates made by compression molding a laminate of said woven fabrics are high in strength.

9 Claims, 1 Drawing Sheet

WOVEN FABRIC FOR FIBER-REINFORCED THERMOPLASTIC RESIN LAMINATE

This application is a continuation of U.S. application Ser. No. 157,711, filed Feb. 19, 1988, now abandoned.

BACKGROUND OF THE INVENTION

The present invention relates to a composite fabric (a mixed fabric) composed of reinforcing yarns and thermoplastic resin yarns which is suitable to be used as a laminating material for making fiber-reinforced thermoplastic resin laminates.

Fiber-reinforced thermoplastic resin materials have been used in various fields and methods for production thereof are explained below with reference to thermoplastic resin reinforced by glass fiber which is a typical material.

(1) Chopped glass fibers of 3-6 mm in length are mixed with a resin and kneaded with heating into compound. This compound is molded by an injection molding machine.

(2) Continuous glass fibers are impregnated and coated with a heat molten resin. This coated fibers are cut to 3-6 mm in length and suitably made into a compound comprising mixture of the fibers and the resin, which is molded by an injection molding machine.

(3) A chopped strand mat is previously made from chopped glass fibers of 2.5-5.0 mm and is impregnated with a molten resin to make a sheet-like compound, which is molded by compression molding under heating.

(4) Continuous glass fibers arranged in the form of sheet or a glass fiber fabric is impregnated with a molten resin or a resin dissolved in a solvent, followed by evaporation of the solvent and drying and then making it into a sheet-like compound, which is molded by compression molding under heating.

(5) Glass fibers and thermoplastic resin fibers are subjected to intermingling to produce hybrid yarns, from which a fabric is made and the fabric is heated to melt the thermoplastic resin fibers. Then, this fabric is compression molded. (cf. Japanese Patent Unexamined Publication (Kokai) No. 130345/86).

However, these conventional methods all have problems as explained below.

(1) It is difficult in case of injection molding method to increase the content of reinforcing glass fibers to more than 30% by weight. Besides, molded articles are limited to those of small size.

(2) According to compression molding under heating, sufficient pressure cannot be applied to the sheet-like compound made by impregnating a chop mat with molten resin and glass fibers arranged in the form of sheet impregnated with resin because glass fibers drift together with resin and as a result, bubbles are entrapped in the molded articles.

In order to prevent the retention of bubbles, the compound must be put in a mold to prevent drifting of the glass fibers and thus, moldability becomes inferior.

(3) According to the method of making glass fibers and thermoplastic resin fibers into a yarn by intermingling and making a fabric therefrom, cost is increased due to the additional one step of intermingling and there are difficulties in doubling and weaving because the yarn is composite yarn of different materials.

These problems are serious not only in use of glass fibers as reinforcing fiber, but also in use of carbon fibers or aramide fibers.

SUMMARY OF THE INVENTION

The object of the present invention is to provide a woven fabric usable for producing a fiber-reinforced thermoplastic resin laminate having high strength and high modulus and large fabric articles at low cost.

DESCRIPTION OF THE INVENTION

The present invention resides in a woven fabric for fiber-reinforced thermoplastic resin laminates, characterized in that said woven fabric comprises warps and wefts each of which comprises at least one kind of thermoplastic resin yarn and at least one kind of reinforcing yarn and even only the reinforcing yarns which constitute the warp and weft constitute a weave construction.

That is, the woven fabric of the present invention is a mixed woven fabric of reinforcing yarns and thermoplastic resin yarns and if the thermoplastic resin yarns have been removed from the warps and wefts which constitute the fabric, the weave construction is retained by only the remaining reinforcing yarns.

Figure 1:
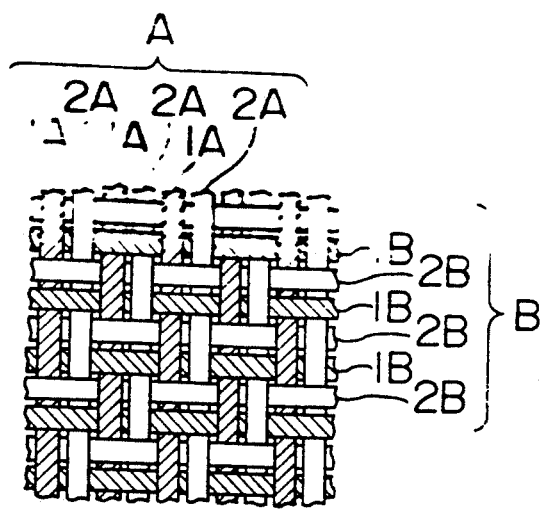
FIG. 1 is a plan view of the woven fabric of the present invention which shows one example of the weave.
Figure 2:
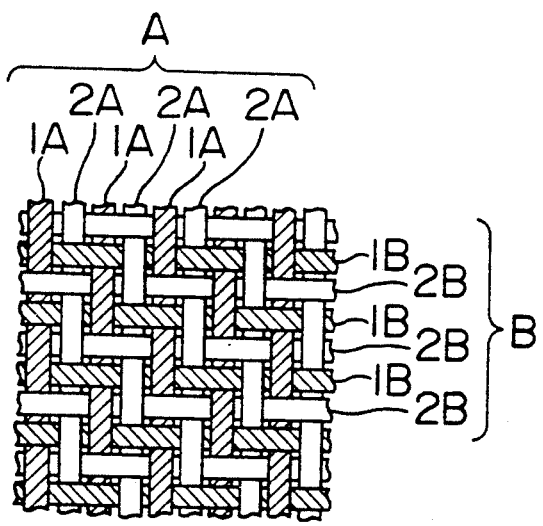
FIG. 2 is a plan view which shows another example of the weave of the present invention.

As foundation weaves of the woven fabric of the present invention, for example, regular basket weave and even sided twill weave may be employed. FIG. 1 shows 2/2 regular basket weave wherein A indicates warp, 1A indicates reinforcing yarn, 2A indicates thermoplastic resin yarn, B indicates weft, 1B indicates reinforcing yarn and 2B indicates thermoplastic resin yarn. This regular basket weave can be considered as follows: That is, one reinforcing yarn 1A and one thermoplastic resin yarn 2A are used as a pair of warps, and one reinforcing yarn 1B and one thermoplastic resin yarn 2B are used as a pair of wefts, and these are woven in plain weave. Therefore, in case all of the thermoplastic resin yarns 2A of warps A and thermoplastic resin yarns 2B of wefts B are removed, only the reinforcing yarns 1A and 1B remain with constituting and retaining a plain weave. FIG. 2 is a plan view of 2/2 even sided twill weave wherein the marks A, B, 1A, 1B, 2A and 2B have the same meanings as in FIG. 1. In this FIG. 2, if all of the thermoplastic resin yarns 2A of warps A and the thermoplastic resin yarns 2B of wefts B are removed, the remaining reinforcing yarns 1A and 1B also constitute a plain weave.

Figure 3:
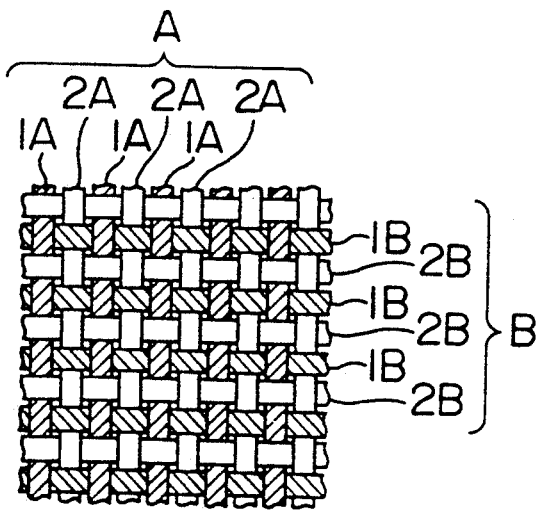
FIG. 3 is a plan view of plain weave made of reinforcing yarn and thermoplastic resin yarn arranged alternately.

When a suitable number of the above mentioned composite woven fabrics are laid up and pressed in a hot pressing machine at a temperature higher than the melting point of the thermoplastic resin yarns, the thermoplastic resin yarns of warps and wefts of the woven fabric are molten while the reinforcing yarns remain as they are and these remaining reinforcing yarns as such maintain the state of woven fabric. Therefore, when a certain pressure is applied thereto in this state, the molten thermoplastic resin flows and impregnated in the reinforcing yarns and excess resin runs out together with bubbles. In this case, since the reinforcing yarns as such constitute a weave construction, they are hardly drifted. Therefore, sufficient pressure can be applied at pressing operation and thus, impregnation of the molten resin into reinforcing yarns and elimination of bubbles can be effectively accomplished. As a result, there is produced a laminate superior in strength and modulus wherein thermoplastic resin is well impregnated in reinforcing yarns with less bubbles and effects of the reinforcing yarns are sufficiently exhibited. In the case of composite woven fabric as shown in FIG. 3 wherein reinforcing yarns 1A or 1B and thermoplastic resin yarns 2A or 2B are merely alternately arranged in the form of a plain weave, reinforcing yarns 1A of warp are merely put on reinforcing yarns 1B of weft and they do not constitute a weave construction. Therefore, application of pressure at pressing operation causes drifting of the reinforcing yarns and so sufficient pressure cannot be applied and thus the reinforcing yarns cannot be uniformly present. Therefore, good laminate cannot be obtained.

The weave construction formed only by reinforcing yarns after the thermoplastic resin yarns have been molten in the present invention is preferably a plain weave from the point of resistance against drift of yarns when pressure is applied, but may also be other weaves such as, for example, twill weave and satin weave.

Further, in order that molten thermoplastic resin can be sufficiently impregnated between filaments of reinforcing yarns to provide molded products with good strength characteristics, reinforcing yarns and thermoplastic resin yarns are preferably arranged as close to each other as possible. That is, it is most preferred that reinforcing yarn and thermoplastic resin yarn are alternately arranged one by one. As mixed woven fabrics wherein reinforcing yarns constitute a plain weave after thermoplastic resin yarns have been molten and thermoplastic resin yarn and reinforcing yarn are arranged alternately one by one, mention may be made of the above mentioned regular basket weave (2/2) and even sided twill weave. However, the present invention is not limited to these weaves.

The thermoplastic resin yarns used for the woven fabrics of the present invention have no limitation as far as they can be shaped into fibrous state and there may be used, for example, polypropylene, polyethylene, polyamide, polyester, polycarbonate, polyacetal, polysulfone, polyether sulfone, polyether ether ketone, polyether ketone, polyetherimide, polyphenylene sulfide and the like. The form of yarns is either a bundle of continuous filaments or staple yarns.

The thermoplastic resin continuous yarns include, for example, the following.

(1) Diameter of monofilament is 10-200 μm, preferably 40-80 μm.

(2) The number of bundled filaments has no limitation.

(3) Twist is not necessarily required, but is preferably 0.3-2.0 T/25 mm in number of twist.

(4) Sizing agent is not necessarily required, but there may be used low molecular weight compounds such as polyethylene glycol and ethylene oxide-propylene oxide copolymers.

As the reinforcing yarns used for the woven fabrics of the present invention, there may be used any of those which have a melting point higher than that of the thermoplastic resin fiber yarns such as, for example, glass fibers, carbon fibers, aramide fibers, alumina fibers and metallic fibers. The form of the reinforcing yarns may also be either bundle of continuous filaments or staple yarn.

Glass fibers have already been widely used as reinforcing fibers for fiber-reinforced thermoplastic resin materials and are also useful as reinforcing yarns in the present invention. Ordinarily, glass fibers for weaving are bundled with a starch type sizing agent at preparation thereof. Since this sizing agent reduces bonding effect between matrix resin and glass fibers and further, prevents penetration, namely, impregnated of matrix resin between filaments which constitute the yarns, conventionally a reinforcing fabric is woven with glass fibers, then this fabric is put in a furnace to burn and remove the sizing agent and thereafter, resin is impregnated in the reinforcing fabric. However, since according to the present invention, glass fibers and thermoplastic resin yarns are woven together, the sizing agent applied to the glass fibers cannot be burned and removed after weaving and there sometimes occur the problems that use of glass fibers applied with a starch type sizing agent causes reduction of bonding strength between the resin and the glass fibers and insufficient impregnation of the resin. Therefore, suitable sizing agents to be applied to the glass fibers used in the present invention are those which increase bonding effect between matrix resin and glass fibers and makes satisfactory impregnation of the resin possible. For example, those comprising the following components can be used.

(1) Film-forming component

At least one of epoxy resin, ethylene oxide-modified epoxy resin, amine-modified epoxy resin, urethane resin, urethane-modified polyester resin or mixtures thereof. Vinyl acetate resin, ethylene-vinyl acetate resin, low molecular weight polyester resins, etc. which are often used for glass roving are not preferred because they are partially decomposed by heating at molding.

(2) Silane coupling component

At least one or mixtures of γ-aminopropyltriethoxysilane, γ-(2-aminoethyl)aminopropyltrimethoxysilane, γ-glycidoxypropyltrimethoxysilane, γ-methacryloxypropyltrimethoxysilane, vinyl tri-β-methoxyethoxysilane, N-γ-(N-vinylbenzylaminoethyl)-γ-aminopropyltrimethoxysilane hydrochloride, dehydrochlorination product thereof, γ-chloropropyltrimethoxysilane, γ-mercaptopropyltrimethoxysilane, γ-aminopropylmethyldimethoxysilane and γ-(2-aminoethyl)aminopropylmethyldimethoxysilane.

(3) Cationic surfactant component

At least one or mixture of quaternary ammonium salt type and amine type surfactants.

(4) Other lubricating component

At least one of mixtures of silicone, wax and ester wax type lubricants.

Adhesion rate of these sizing agents is preferably 0.2-1.0% by weight.

Since the epoxy resin, urethane resin and modified products thereof contained as a film forming agent in the above sizing agents have compatibility with matrix resin and the silane coupling agent increases bonding effect between the matrix resin and the surface of glass fibers, the sizing agent formed on the surface of glass fiber acts as an adhesive between matrix resin and glass fibers. Further, since the sizing agent has compatibility with matrix resin, the matrix resin easily penetrates into the glass yarns, being different from the case of starch type sizing agent. That is, impregnation readily occurs. Thus, use of glass fibers applied with the sizing agent comprising above components as reinforcing yarns gives sufficient reinforcing effect and affords a thermoplastic resin laminate superior in mechanical strength.

When glass fibers are used as the reinforcing yarns of the present invention, those which have the following forms may be used.

(1) Diameter of monofilament is 3-23 μm, preferably 5-10 μm.

(2) Number of bundled filaments is preferably 100-800.

(3) Number of twists is desirably 0.5-2.0 T/25 mm.

Use of other forms results in increase of cost and causes troubles in handling.

The present invention is further explained by the following examples.

EXAMPLE 1

The following reinforcing yarns and thermoplastic resin yarns were woven under the following weaving conditions to obtain a composite woven fabric having the following characteristics.

(1) Reinforcing yarns
  (a) Materials
    Glass yarns (ECG37 1/0-1Z)
  (b) Form
    Diameter of monofilament: 9 μm
    Number of bundled monofilaments: 800
    Strand tex: 135 (G/1000 m)
  (c) Components of sizing agent
    (1) Film forming component: Epoxy 828 ethylene oxide adduct: 3.0%
    (2) Coupling agent: γ-aminopropyltriethoxysilane: 0.5%
    (3) Lubricant:
      (i) Tetraethylenepentammine distearate: 0 05%
      (ii) Epoxy-modified silicone emulsion: 0.2%
      (iii) Polyoxyethylenenonyl phenyl ether: 0.2%
      (iv) Low molecular weight polyethylene emulsion: 0.1%
    (4) Adhesion rate of sizing agent: 0.4%
(2) Thermoplastic resin yarns
  (a) Materials: Polyamide long fibers (nylon 6)
  (b) Form:
    Diameter of monofilament: 40 μm
    Number of bundled monofilaments: 68
    Strand tex: 117 (1050 deniers)
(3) Weaving conditions
  (a) Weave: 2/2 regular basket weave (cf. FIG. 1)
  (b) Loom: Rapier loom having two-stage beam.
  Dobby shedding device is provided for warp and weft selection device of two color weft mixer is provided for weft.
  (c) Weaving method:
    For warp, glass yarn and nylon yarn are prepared for each of two beams and one warp consists of two yarns of one glass yarn and one nylon yarn.
    For weft, glass yarn and nylon yarn are alternately beaten into one shed by two color weft mixer.
(4) Characteristics of mixed woven fabric
  (a) Yarn count:
    Warp: 20 yarns (20 glass yarns+20 nylon yarns)/25 mm
    Weft: 18 yarns (18 glass yarns+18 nylon yarns)/25 mm
  (b) Weight:
    393.1 g/m$^2$ (glass 210.6 g and nylon 182.5 g)
  (c) Amount of resin: 46%

EXAMPLE 2

The following reinforcing yarns and thermoplastic yarns were woven under the following weaving conditions to obtain a composite woven fabric having the following characteristics.

(1) Reinforcing yarns: Same as used in Example 1
(2) Thermoplastic resin yarns: Same as used in Example 1
(3) Weaving conditions:
  (a) Weave: 2/2 even sided twill weave (cf. FIG. 2)
  (b) Loom : Rapier loom of two-beam type
  For warp, dobby shedding device is provided and for weft, two color weft mixer is provided.
  (c) Weaving method:
    For warp, glass yarn and nylon yarn are prepared for each of the two beams and are alternately arranged one by one and 2/2 even sided twill weave is made by dobby shedding.
    For weft, glass yarn and nylon yarn are alternately beaten into by two color weft mixer.
(4) Characteristics of mixed woven fabric
  (a) Count:
    Warp: 40 yarns (20 glass yarns+20 nylon yarns)/25 mm
    Weft: 32 yarns (16 glass yarns+16 nylon yarns)/25 mm
  (b) Weight: 373.4 g/m$^2$ (glass 200.0 g and nylon 173.4 g)
  (c) Amount of resin: 46%

EXAMPLE 3

The following reinforcing yarns and thermoplastic resin yarns were woven under the following weaving conditions to obtain a composite woven fabric having the following characteristics.

(1) Reinforcing yarns:
  Same as used in Example 1 except that S-glass (high strength and high modulus glass fibers of high SiO$_2$ content)
(2) Thermoplastic resin yarns: Same as used in Example 1
(3) Weaving conditions: Same as in Example 1
(4) Characteristics of composite woven fabric
  (a) Count:
    Warp: 40 yarns (20 glass yarns+20 nylon yarns)/25 mm
    Weft: 32 yarns (16 glass yarns+16 nylon yarns)/25 mm
  (b) Weight: 373.4 g/m$^2$ (glass 200.0 g and nylon 173.4 g)
  (c) Amount of resin: 46%

EXAMPLE 4

The following reinforcing yarns and thermoplastic resin yarns were woven under the following conditions to obtain a composite woven fabric having the following characteristics.

(1) Reinforcing yarns:
  Carbon continuous fibers (T300 manufactured by Toray Industries, Inc.)
  1000 filaments
  594 deniers (66 tex)

(2) Thermoplastic resin yarns:
PEEK (polyether ether ketone)
Diameter of monofilament 70 μm
12 filaments
540 deniers (60 tex)
(3) Weaving conditions: Same as in Example 1
(4) Characteristics of composite woven fabric
(a) Count:
  Warp 24 yarns (24 carbon yarns + 24 PEEK yarns)/25 mm
  Weft: 20 yarns (20 carbon yarns + 20 PEEK yarns)/25 mm
(b) Weight: 221.8 g/m² (carbon 116.2 g and PEEK 105.6 g)
(c) Amount of resin: 48%

EXAMPLE 5

The following reinforcing yarns and thermoplastic resin yarns were woven under the following weaving conditions to obtain a composite woven fabric having the following characteristics.
(1) Reinforcing yarns:
  Glass fibers (ECG37 1/0-1Z) with a sizing agent for general fabrics containing starch as film forming component and no coupling agent. Other components are the same as in Example 1.
(2) Thermoplastic resin yarns: Same as used in Example 1
(3) Weaving conditions: Same as in Example 1
(4) Characteristics of composite woven fabric: Same as in Example 1.

COMPARATIVE EXAMPLE 1

The following reinforcing yarns and thermoplastic resin yarns were woven under the following weaving conditions to obtain a composite woven fabric.
(1) Reinforcing yarns: Same glass fibers as used in Example 1
(2) Thermoplastic resin yarns: Same as used in Example 1
(3) Weaving conditions:
  (a) Weave: Plain weave (cf. FIG. 3)
  (b) Loom: Same as used in Example 1
  (c) Weaving method:
    For warp, glass yarn and nylon yarn are prepared for each of two beams and are arranged alternately one by one. For weft, glass yarn and nylon yarn are alternately beaten into by two color weft mixer.
(4) Characteristics of composite woven fabric
  (a) Count:
    Warp 40 yarns (20 glass yarns + 20 nylon yarns)/25 mm
    Weft: 32 yarns (16 glass yarns + 16 nylon yarns)/25 mm
  (b) Weight: 373.4 g/m² (glass 100.0 g and nylon 173.4 g)
  (c) Amount of resin: 46%

Composite woven fabrics obtained in each of Examples 1–5 and Comparative Example 1 were laminated and compression molded at 260° C. (400° C. in Example 4) to obtain a molded product. Characteristics of the molded product are shown in the following table.

The laminate obtained in Comparative Example 1 was not able to be molded into the same molded product as other products even under the same molding conditions because the glass fibers were drifted with the resin and characteristics of the molded product were not measured.

TABLE 1

| | | Example 1 | Example 2 | Example 3 | Example 4 | Example 5 | Comparative Example 1 |
|---|---|---|---|---|---|---|---|
| Flexural strength (Lengthwise direction) (kg/mm²) | Dry state | 46.8 | 45.7 | 55.3 | 67.8 | 30.3 | — |
| | 2 hours boil H₂O | 29.0 | 27.4 | 33.3 | | 11.8 | — |
| Bending modulus (Lengthwise direction) (kg/mm²) | Dry state | 1,840 | 1,810 | 2,140 | 4,850 | 1,680 | — |
| | 2 hours boil H₂O | 1,470 | 1,540 | 1,690 | | 1,120 | — |
| Coloration of molded products | | no | no | no | no | Brown | no |
| Content of reinforcing fibers in volume (%) | | 46 | 44 | 44 | 53 | 47 | — |
| Form of reinforcing yarns in the molded products | | Woven fabric (Plain weave) | Woven fabric (Plain weave) | Woven fabric (Plain weave) | Woven fabric (Plain weave) | Woven fabric (Plain weave) | * |

*Non woven fabric, the strands arranged side by side for both warp and weft

As is clear from the above table, glass yarns were drifted at the time of melting of resin and satisfactory molding cannot be accomplished in Comparative Example 1. Thus, only in the weaves as in the present invention the glass fibers are retained in the form of a woven fabric after molding. Further, when glass fibers are used as reinforcing yarns, (1) characteristics of molded products such as flexural strength and flexural modulus are much superior and (2) no coloration of molded products occurs in case of using sizing agents capable of being an adhesive between glass fibers and thermoplastic resin (Example 1) as compared with the case of using the normal starch type sizing agent (Example 5).

As explained above, the woven fabric used for fiber-reinforced thermoplastic resin laminates of the present invention is characterized in that each of warp and weft which constitute the woven fabric consists of at least one kind of thermoplastic resin yarn and at least one kind of reinforcing yarn and furthermore, even only the reinforcing yarns of warps and wefts constitute a weave. Therefore, it is possible to produce a fiber-reinforced thermoplastic resin laminate by laminating said woven fabrics and molding the laminate with heating to melt the thermoplastic resin yarns and impregnate the molten thermoplastic resin yarns into the reinforcing yarns to bond them. In this case, since the reinforcing yarns as such have a weave construction, they are not drifted with molten resin and thus superior molded products of high strength can be obtained. Besides, since the warp and weft used in the present invention consist of respectively independent reinforcing yarns and thermoplastic resin yarns and it is not necessary to produce composite yarns by mixing reinforcing fibers and thermoplastic resin fibers, production steps are simple and cost for production is low.

We claim:

1. A woven fabric for a fiber-reinforced thermoplastic resin laminate, said fabric comprising warps and wefts, wherein each of said warps and wefts includes at least one separate thermoplastic resin yarn and at least one separate high-modulus reinforcing yarn, said thermoplastic resin yarns and said reinforcing yarns being arranged alternately, and wherein said reinforcing yarns of the warps and wefts constitute a weave by themselves.

2. A woven fabric according to claim 1 wherein the weave constituted of only the reinforcing yarns is a plain weave.

3. A woven fabric according to claim 1 which has a regular basket weave constituted, in the form of plain weave, of warps and wefts each of which is constituted of at least two yarns including at least one reinforcing yarn and at least one thermoplastic resin yarn.

4. A woven fabric according to claim 1 which has an even sided twill weave constituted of warps and wefts each of which comprises reinforcing yarns and thermoplastic resin yarns which are alternately arranged.

5. A woven fabric according to claim 1 wherein the reinforcing yarn comprises a plurality of bundled glass fibers with a sizing agent, said sizing agent including:
at least one film forming agent selected from the group consisting of epoxy resin, amine-modified epoxy resin, urethane resin and urethane-modified resin;
a silane coupling agent; and
a cationic surfactant.

6. A woven fabric according to claim 5 wherein the sizing agent additionally contains a lubricant.

7. A woven fabric according to claim 5 wherein the glass yarn has a monofilament diameter of 3–23μ, number of bundled filaments of 100–800 and a twist number of 0.5–2.0 T/25 mm.

8. A fiber-reinforced thermoplastic resin laminate produced by laminating the woven fabrics of claim 1 and molding the laminate upon heating at a temperature higher than the melting point of the thermoplastic resin yarns.

9. A woven fabric according to claim 1 wherein said reinforcing yarns have a melting point higher than the melting point of said thermoplastic yarns.

* * * * *